(12) United States Patent
Kataoka et al.

(10) Patent No.: US 8,055,372 B2
(45) Date of Patent: Nov. 8, 2011

(54) PROCESSING SYSTEM, PROCESSING METHOD, AND COMPUTER PROGRAM

(75) Inventors: Yuki Kataoka, Sapporo (JP); Tatsuya Yamaguchi, Nirasaki (JP); Wenling Wang, Nirasaki (JP); Yuichi Takenaga, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 924 days.

(21) Appl. No.: 12/073,063

(22) Filed: Feb. 28, 2008

(65) Prior Publication Data

US 2009/0117259 A1    May 7, 2009

(30) Foreign Application Priority Data

Mar. 5, 2007 (JP) .................................. 2007-054092

(51) Int. Cl.
G06F 19/00 (2011.01)
G05B 13/02 (2006.01)
G05D 7/00 (2006.01)
C23C 16/52 (2006.01)
B05C 11/00 (2006.01)

(52) U.S. Cl. ............ 700/109; 700/29; 700/30; 700/282; 427/8; 118/665; 118/697

(58) Field of Classification Search ............ 700/29, 700/30, 108–110, 121, 282; 427/8, 9; 118/697, 118/665
See application file for complete search history.

(56) References Cited

U.S. PATENT DOCUMENTS

| | | | |
|---|---|---|---|
| 6,913,938 B2 * | 7/2005 | Shanmugasundram et al. | 438/16 |
| 2010/0161103 A1 * | 6/2010 | Schaller et al. | 700/108 |

FOREIGN PATENT DOCUMENTS

| | | |
|---|---|---|
| JP | 5-308053 | 11/1993 |
| JP | 11-121389 | 4/1999 |
| JP | 3081969 | 6/2000 |
| JP | 2003-166066 | 6/2003 |
| JP | 2004-253493 | 9/2004 |

OTHER PUBLICATIONS

Japanese Office Action mailed on Dec. 1, 2009 for Japanese Application No. 2007054092 with English translation.
Japanese Office Action issued on Feb. 17, 2009 with English translation.
Korean Office Action issued on Apr. 20, 2010 for Application No. 10-2008-19869 w/ English language translation.

* cited by examiner

*Primary Examiner* — Sean Shechtman
(74) *Attorney, Agent, or Firm* — Smith, Gambrell & Russell, LLP

(57) ABSTRACT

The present invention provides a processing system, a processing method and a program, which can readily control a gas flow rate. A vertical-type heating apparatus 1 includes a plurality of gas supply pipes 16 to 20 each adapted for supplying a processing gas into a reaction vessel 2 configured to contain therein semiconductor wafers W. For the gas supply pipes 16 to 20, flow rate control units 21 to 25 are provided, respectively, for controlling each flow rate. In a control unit 50, processing conditions including the flow rate of the processing gas and a film thickness-flow rate-relationship model indicative of a relationship between the flow rate of the processing gas and a film thickness, are stored. The control unit 50 calculates the flow rate of the processing gas based on a process result obtained by processing the semiconductor wafers W under the processing conditions as well as on the film thickness-flow rate-relationship model, so as to process the semiconductor wafers W, while controlling the respective flow rate control units 21 to 25, such that the flow rate of the processing gas will be changed into the calculated flow rate of the processing gas.

17 Claims, 13 Drawing Sheets

PROCESS CONDITION 1 (TEMPERATURE:900°C, HYDROGEN PARTIAL PRESSURE RATIO:10%,
PRESSURE:40Pa, GAS TOTAL FLOW RATE:5000sccm)

| | FLOW RATE OF EACH SUB-SUPPLY PIPE | | | FILM THICKNESS OF EACH ZONE | | | | |
|---|---|---|---|---|---|---|---|---|
| | SUB-PIPE 1 | SUB-PIPE 2 | SUB-PIPE 3 | ZONE1 | ZONE2 | ZONE3 | ZONE4 | ZONE5 |
| CONDITION 1-1 | 100 | 100 | 100 | 9.2 | 9.1 | 9.3 | 9.2 | 9.1 |
| CONDITION 1-2 | 200 | 100 | 100 | 9.4 | 9.6 | 10.1 | 9.8 | 9.7 |
| CONDITION 1-3 | 100 | 200 | 100 | 9.2 | 9.2 | 9.5 | 9.8 | 9.8 |
| CONDITION 1-4 | 100 | 100 | 200 | 9.2 | 9.1 | 9.3 | 9.4 | 9.7 |

(sccm)           (nm)

(a) PROCESS CONDITION 2 (TEMPERATURE:800°C, HYDROGEN PARTIAL PRESSURE RATIO:10%, PRESSURE:40Pa, GAS TOTAL FLOW RATE:5000sccm)

| | FLOW RATE OF EACH SUB-SUPPLY PIPE | | | FILM THICKNESS OF EACH ZONE | | | | |
|---|---|---|---|---|---|---|---|---|
| | SUB-PIPE 1 | SUB-PIPE 2 | SUB-PIPE 3 | ZONE1 | ZONE2 | ZONE3 | ZONE4 | ZONE5 |
| CONDITION 2-1 | 100 | 100 | 100 | 6.5 | 6.4 | 6.6 | 6.4 | 6.5 |
| CONDITION 2-2 | 200 | 100 | 100 | 6.7 | 6.8 | 7.1 | 7 | 6.8 |
| CONDITION 2-3 | 100 | 200 | 100 | 6.5 | 6.4 | 6.7 | 7.1 | 6.8 |
| CONDITION 2-4 | 100 | 100 | 200 | 6.5 | 6.4 | 6.5 | 6.6 | 6.9 |
| | (sccm) | | | (nm) | | | | |

(b) PROCESS CONDITION 3 (TEMPERATURE:900°C, HYDROGEN PARTIAL PRESSURE RATIO: 5%, PRESSURE:40Pa, GAS TOTAL FLOW RATE:5000sccm)

| | FLOW RATE OF EACH SUB-SUPPLY PIPE | | | FILM THICKNESS OF EACH ZONE | | | | |
|---|---|---|---|---|---|---|---|---|
| | SUB-PIPE 1 | SUB-PIPE 2 | SUB-PIPE 3 | ZONE1 | ZONE2 | ZONE3 | ZONE4 | ZONE5 |
| CONDITION 3-1 | 100 | 100 | 100 | 8.9 | 8.8 | 8.9 | 8.7 | 8.7 |
| CONDITION 3-2 | 200 | 100 | 100 | 9.1 | 9.3 | 9.7 | 9.3 | 9.2 |
| CONDITION 3-3 | 100 | 200 | 100 | 8.9 | 8.9 | 9.1 | 9.3 | 9.2 |
| CONDITION 3-4 | 100 | 100 | 200 | 8.9 | 8.9 | 8.8 | 8.9 | 9.3 |
| | (sccm) | | | (nm) | | | | |

PROCESS CONDITION 4 (TEMPERATURE:900°C, HYDROGEN PARTIAL PRESSURE RATIO:10%,
PRESSURE:67Pa, GAS TOTAL FLOW RATE:5000sccm)

| | FLOW RATE OF EACH SUB-SUPPLY PIPE | | | FILM THICKNESS OF EACH ZONE | | | | |
|---|---|---|---|---|---|---|---|---|
| | SUB-PIPE 1 | SUB-PIPE 2 | SUB-PIPE 3 | ZONE1 | ZONE2 | ZONE3 | ZONE4 | ZONE5 |
| CONDITION 4-1 | 100 | 100 | 100 | 10.3 | 10 | 9.8 | 9.7 | 9.5 |
| CONDITION 4-2 | 200 | 100 | 100 | 10.6 | 10.6 | 10.5 | 10.2 | 9.8 |
| CONDITION 4-3 | 100 | 200 | 100 | 10.4 | 10.1 | 10.1 | 10.3 | 9.9 |
| CONDITION 4-4 | 100 | 100 | 200 | 10.3 | 10 | 9.8 | 10 | 10.1 |
| | (sccm) | | | (nm) | | | | |

(b)

PROCESS CONDITION 5 (TEMPERATURE:900°C, HYDROGEN PARTIAL PRESSURE RATIO:10%,
PRESSURE:40Pa, GAS TOTAL FLOW RATE:3500sccm)

| | FLOW RATE OF EACH SUB-SUPPLY PIPE | | | FILM THICKNESS OF EACH ZONE | | | | |
|---|---|---|---|---|---|---|---|---|
| | SUB-PIPE 1 | SUB-PIPE 2 | SUB-PIPE 3 | ZONE1 | ZONE2 | ZONE3 | ZONE4 | ZONE5 |
| CONDITION 5-1 | 100 | 100 | 100 | 8.7 | 8.6 | 8.7 | 8.5 | 8.3 |
| CONDITION 5-2 | 200 | 100 | 100 | 8.9 | 9.1 | 9.5 | 9.1 | 8.9 |
| CONDITION 5-3 | 100 | 200 | 100 | 8.7 | 8.7 | 8.9 | 9.1 | 9 |
| CONDITION 5-4 | 100 | 100 | 200 | 8.7 | 8.6 | 8.7 | 8.7 | 8.9 |
| | (sccm) | | | (nm) | | | | |

(a) REFERENCE FILM THICKNESS

| ZONE1 | ZONE2 | ZONE3 | ZONE4 | ZONE5 |
|---|---|---|---|---|
| 9.2 | 9.1 | 9.3 | 9.2 | 9.1 |
| 9.4 | 9.6 | 10.1 | 9.8 | 9.7 |
| 9.2 | 9.2 | 9.5 | 9.8 | 9.8 |
| 9.2 | 9.1 | 9.3 | 9.4 | 9.7 |

(nm)

(b) CHANGED FILM THICKNESS

| ZONE1 | ZONE2 | ZONE3 | ZONE4 | ZONE5 |
|---|---|---|---|---|
| 6.5 | 6.4 | 6.6 | 6.4 | 6.5 |
| 6.7 | 6.8 | 7.1 | 7 | 6.8 |
| 6.5 | 6.4 | 6.7 | 7.1 | 6.8 |
| 6.5 | 6.4 | 6.5 | 6.6 | 6.9 |

(nm)

(c) INTERPOLATED FILM THICKNESS

| ZONE1 | ZONE2 | ZONE3 | ZONE4 | ZONE5 |
|---|---|---|---|---|
| 7.8 | 7.7 | 7.9 | 7.8 | 7.7 |
| 8 | 8.1 | 8.5 | 8.3 | 8.2 |
| 7.8 | 7.7 | 8 | 8.4 | 8.2 |
| 7.8 | 7.7 | 7.8 | 7.9 | 8.2 |

(nm)

(d) CHANGING RATE DUE TO TEMPERATURE CHANGE

| ZONE1 | ZONE2 | ZONE3 | ZONE4 | ZONE5 |
|---|---|---|---|---|
| −0.15 | −0.15 | −0.15 | −0.15 | −0.15 |
| −0.15 | −0.16 | −0.16 | −0.15 | −0.15 |
| −0.15 | −0.16 | −0.16 | −0.14 | −0.16 |
| −0.15 | −0.15 | −0.16 | −0.16 | −0.15 |

FIG. 7

(a) CHANGING RATE DUE TO CHANGE OF THE HYDROGEN PARTIAL PRESSURE RATIO

| ZONE1 | ZONE2 | ZONE3 | ZONE4 | ZONE5 |
|---|---|---|---|---|
| 0.03 | 0.03 | 0.04 | 0.05 | 0.04 |
| 0.03 | 0.03 | 0.04 | 0.05 | 0.05 |
| 0.03 | 0.03 | 0.04 | 0.05 | 0.06 |
| 0.03 | 0.02 | 0.05 | 0.05 | 0.04 |

(b) CHANGING RATE DUE TO PRESSURE CHANGE

| ZONE1 | ZONE2 | ZONE3 | ZONE4 | ZONE5 |
|---|---|---|---|---|
| 0.07 | 0.05 | 0.03 | 0.03 | 0.02 |
| 0.07 | 0.06 | 0.02 | 0.02 | 0.01 |
| 0.08 | 0.05 | 0.03 | 0.03 | 0.01 |
| 0.07 | 0.05 | 0.03 | 0.03 | 0.02 |

(c) CHANGING RATE DUE TO CHANGE OF THE GAS TOTAL FLOW RATE

| ZONE1 | ZONE2 | ZONE3 | ZONE4 | ZONE5 |
|---|---|---|---|---|
| −0.01 | −0.01 | −0.01 | −0.01 | −0.02 |
| −0.01 | −0.01 | −0.01 | −0.01 | −0.02 |
| −0.01 | −0.01 | −0.01 | −0.01 | −0.02 |
| −0.01 | −0.01 | −0.01 | −0.01 | −0.02 |

FIG. 8

| ZONE1 | ZONE2 | ZONE3 | ZONE4 | ZONE5 |
|---|---|---|---|---|
| 8.48 | 8.29 | 8.41 | 8.39 | 8.04 |
| 8.77 | 8.78 | 8.92 | 8.81 | 8.54 |
| 8.56 | 8.29 | 8.51 | 9.00 | 8.62 |
| 8.48 | 8.21 | 8.39 | 8.49 | 8.54 |

| | ZONE1 | ZONE2 | ZONE3 | ZONE4 | ZONE5 |
|---|---|---|---|---|---|
| Bare Si | -5.08 | -4.81 | -5.62 | -5.73 | -5.84 |
| FIVE TIMES THE PATTERN SURFACE AREA | -8.95 | -9.19 | -10.14 | -11.95 | -12.20 |

(Å)

(a) RELATIONSHIP BETWEEN THE TEMPERATURE AND

| TEMPERATURE | ABSOLUTE TEMPERATURE | INVERSE NUMBER OF THE ABSOLUTE TEMPERATURE(×1000) | α |
|---|---|---|---|
| 800 | 1073 | 0.93 | 77 |
| 900 | 1173 | 0.85 | 149 |
| 1000 | 1273 | 0.79 | 258 |

(b) EXAMPLE OF THE RECIPE

| TEMPERATURE (°C) | 850 |
|---|---|
| PRESSURE (Pa) | 40 |
| $O_2$ MAIN PIPE(sccm) | 4000 |
| $H_2$ MAIN PIPE(sccm) | 500 |
| $H_2$ SUB-PIPE1(sccm) | 100 |
| $H_2$ SUB-PIPE2(sccm) | 100 |
| $H_2$ SUB-PIPE3(sccm) | 100 |

(c) OXYGEN RADIAL CONCENTRATION IN EACH ZONE

|  | ZONE1 | ZONE2 | ZONE3 | ZONE4 | ZONE5 |
|---|---|---|---|---|---|
| $SiO_2$ Dummy | 0.048 | 0.054 | 0.052 | 0.05 | 0.048 |
| Bare Si | 0.041 | 0.047 | 0.044 | 0.042 | 0.04 |
| FIVE TIMES THE PATTERN SURFACE AREA | 0.036 | 0.041 | 0.038 | 0.034 | 0.032 |

(d) FILM THICKNESS IN EACH ZONE

|  | ZONE1 | ZONE2 | ZONE3 | ZONE4 | ZONE5 |
|---|---|---|---|---|---|
| $SiO_2$ Dummy | 76.90 | 81.00 | 79.66 | 78.29 | 76.90 |
| Bare Si | 71.81 | 76.19 | 74.03 | 72.56 | 71.06 |
| FIVE TIMES THE PATTERN SURFACE AREA | 67.95 | 71.81 | 69.52 | 66.34 | 64.69 |

PROCESSING SYSTEM, PROCESSING METHOD, AND COMPUTER PROGRAM

CROSS REFERENCE TO RELATED APPLICATIONS

This application is based on the prior Japanese Patent Application No. 2007-054092 filed on Mar. 5, 2007, the entire contents of which are incorporated herein by reference.

BACKGROUND OF THE INVENTION

1. Field of the Invention

The present invention relates to a processing system, a processing method and a computer program, each adapted for processing an object or objects to be processed, such as semiconductor wafers, and in particular relates to the processing system, the processing method and the computer program, of a batch type, adapted for collectively processing multiple sheets of objects to be processed.

2. Background Art

In a process of manufacturing semiconductor devices, the batch-type processing system adapted for collectively providing a process, for example, a film-forming process, an oxidizing process, a diffusing process and the like, to the multiple sheets of objects, such as semiconductor wafers or the like, is employed. With such a batch-type processing system, the semiconductor wafers can be performed efficiently. However, it is considerably difficult to secure uniformity of the process for the multiple sheets of semiconductor wafers.

As a technique for solving such a problem, for example, in Patent Document 1, a method for enhancing a yield of the semiconductor devices has been proposed. Namely, in this method, three or more gas injectors, each adapted for introducing a gas, into a diffusion furnace from an upper portion, an intermediate portion and a lower portion thereof, are provided, in order to make a supply amount of the gas uniform by independently controlling their flow rates.

Additionally, Patent Document 2 teaches a heating method, which can perform a significantly uniform process while changing positions for supplying a processing gas or gasses, at least between a central portion and a peripheral portion in a face of each object to be processed, by changing a flow rate of a carrier gas during a heating process.

Furthermore, in Patent Document 3, another method has been proposed, in which a relationship between the flow rate of the processing gas or gasses supplied from a plurality of pipes and a growing speed of a film on each substrate is first estimated, and a film forming process is then performed with the flow rate of the processing gas or gasses supplied from the plurality of pipes being controlled.

Patent Document 1: TOKUKAIHEI No. 11-121389, KOHO

Patent Document 2: TOKKYO No. 3081969, KOHO

Patent Document 3: TOKUKAI No. 2003-166066, KOHO

In the batch-type processing system, although it can provide an appropriate process at a start of operation, it may tend to perform different processes from that planned at the start of operation, through many repetitions of processing operation or by changes of external factors and the like. For instance, in the case of a film-forming process for the semiconductor wafers, even though it can form a film having an appropriate film thickness on each semiconductor wafer at the start of operation, the thickness of the film formed on the semiconductor wafer sometimes changes through repetitions of the film forming process. This might be caused by the supply amount of the gasses that cannot adequately correspond to change over time of the processing furnace of the processing system and/or to change of the external environment. To address such an event, an operator of the processing system must currently control the flow rate of each gas, by experience and/or intuition, in order to secure the uniformity of the thickness of the film formed on each wafer surface. Thus, it is substantially difficult to secure the uniformity of the film thickness in the film forming process. Therefore, there is a need for the processing system and the processing method, by which even the operator having less or no experience and information on the processing system and the process itself can readily control the gas flow rate.

SUMMARY OF THE INVENTION

The present invention was made in light of the above circumstances, and therefore it is an object thereof to provide the processing system, the processing method and the computer program, which can control the gas flow rate with ease.

Another object of the present invention is to provide the processing system, the processing method and the computer program, which can perform an appropriate process, regardless of the change over time and/or the change of the external environment.

To achieve the above object, the processing system related to a first aspect of this invention comprises:

a processing chamber adapted for containing therein an object to be processed;

a processing gas supply means adapted for supplying a processing gas into the processing chamber;

a processing condition storage means adapted for storing therein processing conditions corresponding to details of a process, the processing conditions including a flow rate of the processing gas supplied from the processing gas supply means;

a model storage means adapted for storing therein a flow rate-process result-relationship model indicative of a relationship between the flow rate of the processing gas and a process result;

a flow rate calculating means, into which the process result obtained by processing the object to be processed under the processing conditions stored in the processing condition storage means is inputted, and which is adapted for calculating the flow rate of the processing gas, based on the process result as well as on the flow rate-process result-relationship model stored in the model storage means; and a processing means adapted for processing the object to be processed, while changing the flow rate of the processing gas of the processing conditions into the flow rate of the processing gas calculated by the flow rate calculating means when the flow rate of the processing gas is calculated by the flow rate calculating means.

The processing system related to a second aspect of this invention comprises:

a processing chamber adapted for containing therein an object to be processed or a testing substrate for the object to be processed;

a processing gas supply means adapted for supplying a processing gas into the processing chamber;

a processing condition storage means adapted for storing therein processing conditions corresponding to details of a process, the processing conditions including a flow rate of the processing gas supplied from the processing gas supply means;

an error information storage means adapted for storing therein error information about an error of a process result attributable to a difference between the object to be processed and the testing substrate;

a model storage means adapted for storing therein a flow rate-process result-relationship model indicative of a relationship between the flow rate of the processing gas and the process result;

a processing condition extracting means adapted for calculating a targeted process result of the testing substrate from a targeted process result of the object to be processed, based on the error information stored in the error information storage means, as well as adapted for extracting the processing conditions corresponding to the calculated targeted process result of the testing substrate, from the processing conditions stored in the processing condition storage means;

a testing substrate processing means adapted for processing the testing substrate under the processing conditions extracted by the processing condition extracting means;

a discriminating means adapted for discriminating whether or not the process result obtained by the process due to the testing substrate processing means is within a predetermined range relative to the targeted process result of the testing substrate;

a flow rate calculating means adapted for calculating the flow rate of the processing gas, based on the process result obtained by the process provided to the testing substrate as well as on the flow rate-process result-relationship model stored in the model storage means, when the process result is judged not to be within the predetermined range by the discriminating means; and a flow rate changing means adapted for changing the flow rate of the processing gas of the processing conditions into the flow rate of the processing gas calculated by the flow rate calculating means when the flow rate of the processing gas is calculated by the flow rate calculating means, such that the testing substrate will be processed, at the changed gas flow rate, by the testing substrate processing means.

It is preferred that the processing system further comprises an object processing means, which is adapted for processing the object to be processed under the processing conditions extracted by the processing condition extracting means when the process result is judged to be within the predetermined range by the discriminating means.

The error information storage means may store therein, for example, the error information about a loading effect of the object to be processed and that of the testing substrate.

The flow rate-process result-relationship model may be prepared based on, for example, the process result obtained under two or more conditions, with respect to each element constituting the processing conditions. In this case, the flow rate-process result-relationship model can be adapted for changes of the processing conditions.

The processing gas supply means may include a plurality of processing gas supply pipes respectively inserted through the processing chamber. In this case, the flow rate calculating means is adapted for calculating the flow rate of the gas supplied from each processing gas supply pipe.

The processing system may further comprise a processing condition updating means, which is adapted for updating the flow rate of the processing gas stored in the processing condition storage means by the flow rate of the processing gas calculated by the flow rate calculating means.

The processing chamber may be divided into a plurality of zones. In this case, the model storage means stores therein a flow rate-process result-relationship model indicative of the relationship between the flow rate of the processing gas and the process result for each zone.

The details of the process may be related to, for example, a film forming process.

The processing method related to a third aspect of this invention comprises:

a processing gas supplying step of supplying a processing gas into a processing chamber adapted for containing therein an object to be processed;

a processing condition storing step of storing processing conditions corresponding to details of a process, the processing conditions including a flow rate of the processing gas supplied in the processing gas supplying step;

a model storing step of storing a flow rate-process result-relationship model indicative of a relationship between the flow rate of the processing gas and a process result;

a flow rate calculating step, in which the process result obtained by processing the object to be processed under the processing conditions stored in the processing condition storing step is inputted, and in which the flow rate of the processing gas is calculated, based on the process result as well as on the flow rate-process result-relationship model stored in the model storing step; and a processing step of processing the object to be processed, while changing the flow rate of the processing gas of the processing conditions into the flow rate of the processing gas calculated in the flow rate calculating step when the flow rate of the processing gas is calculated in the flow rate calculating step.

The processing method related to a fourth aspect of this invention comprises:

a processing gas supplying step of supplying a processing gas into a processing chamber adapted for containing therein an object to be processed or a testing substrate for the object to be processed;

a processing condition storing step of storing processing conditions corresponding to details of a process, the processing conditions including a flow rate of the processing gas supplied in the processing gas supplying step;

an error information storing step of storing error information about an error of a process result attributable to a difference between the object to be processed and the testing substrate;

a model storing step of storing a flow rate-process result-relationship model indicative of a relationship between the flow rate of the processing gas and the process result;

a processing condition extracting step of calculating a targeted process result of the testing substrate from a targeted process result of the object to be processed, based on the error information stored in the error information storing step, and then extracting the processing conditions corresponding to the calculated targeted process result of the testing substrate, from the processing conditions stored in the processing condition storing step;

a testing substrate processing step of processing the testing substrate under the processing conditions extracted in the processing condition extracting step;

a discriminating step of discriminating whether or not the process result obtained by the process due to the testing substrate processing step is within a predetermined range relative to the targeted process result of the testing substrate;

a flow rate calculating step of calculating the flow rate of the processing gas, based on the process result obtained by the process provided to the testing substrate as well as on the flow rate-process result-relationship model stored in the model storing step, when the process result is judged not to be within the predetermined range in the discriminating step; and a flow rate changing step of changing the flow rate of the processing gas of the processing conditions into the flow rate of the processing gas calculated in the flow rate calculating step when the flow rate of the processing gas is calculated in the flow rate calculating step, such that the testing substrate will be processed, at the changed gas flow rate, in the testing substrate processing step.

The processing method may further comprise an object processing step, in which the object to be processed is processed under the processing conditions extracted in the processing condition extracting step when the process result is judged to be within the predetermined range in the discriminating step.

In the error information storing step, for example, the error information about a loading effect of the object to be processed and that of the testing substrate may be stored.

The flow rate-process result-relationship model may be prepared based on the process result obtained under two or more conditions, with respect to each element constituting the processing conditions. In this case, the flow rate-process result-relationship model can be adapted for changes of the processing conditions.

In the processing gas supplying step, for example, the processing gas may be supplied from a plurality of processing gas supply pipes respectively inserted through the processing chamber. In this case, in the flow rate calculating step, the flow rate of the gas supplied from each processing gas supply pipes is calculated.

The processing method may further comprise an updating step of updating the flow rate of the processing gas stored in the processing condition storing step by the flow rate of the processing gas calculated in the flow rate calculating step.

The processing chamber may be divided into a plurality of zones. In this case, in the model storing step, the flow rate-process result-relationship model indicative of the relationship between the flow rate of the processing gas and the process result, for each zone, is stored.

The details of the process may be related to a film forming process.

The computer program related to a fifth aspect of the present invention is designed for driving a computer to function as:

a processing gas supply means adapted for supplying a processing gas into a processing chamber adapted for containing therein an object to be processed;

a processing condition storage means adapted for storing therein processing conditions corresponding to details of a process, the processing conditions including a flow rate of the processing gas supplied from the processing gas supply means;

a model storage means adapted for storing therein a flow rate-process result-relationship model indicative of a relationship between the flow rate of the processing gas and a process result;

a flow rate calculating means adapted for calculating the flow rate of the processing gas, based on the process result obtained by processing the object to be processed under the processing conditions stored in the processing condition storage means, as well as on the flow rate-process result-relationship model stored in the model storage means; and a processing means adapted for processing the object to be processed, while changing the flow rate of the processing gas of the processing conditions into the flow rate of the processing gas calculated by the flow rate calculating means when the flow rate of the processing gas is calculated by the flow rate calculating means.

The computer program related to a sixth aspect of the present invention is designed for driving a computer to function as:

a processing gas supply means adapted for supplying a processing gas into a processing chamber adapted for containing therein an object to be processed or a testing substrate for the object to be processed;

a processing condition storage means adapted for storing therein processing conditions corresponding to details of a process, the processing conditions including a flow rate of the processing gas supplied from the processing gas supply means;

an error information storage means adapted for storing therein error information about an error of a process result attributable to a difference between the object to be processed and the testing substrate;

a model storage means adapted for storing therein a flow rate-process result-relationship model indicative of a relationship between the flow rate of the processing gas and the process result;

a processing condition extracting means adapted for calculating a targeted process result of the testing substrate from a targeted process result of the object to be processed, based on the error information stored in the error information storage means, as well as adapted for extracting the processing conditions corresponding to the calculated targeted process result of the testing substrate, from the processing conditions stored in the processing condition storage means;

a testing substrate processing means adapted for processing the testing substrate under the processing conditions extracted by the processing condition extracting means;

a discriminating means adapted for discriminating whether or not the process result obtained by the process due to the testing substrate processing means is within a predetermined range relative to the targeted process result of the testing substrate;

a flow rate calculating means adapted for calculating the flow rate of the processing gas, based on the process result obtained by the process provided to the testing substrate as well as on the flow rate-process result-relationship model stored in the model storage means, when the process result is judged not to be within the predetermined range by the discriminating means; and a flow rate changing means adapted for changing the flow rate of the processing gas of the processing conditions into the flow rate of the processing gas calculated by the flow rate calculating means when the flow rate of the processing gas is calculated by the flow rate calculating means, such that the testing substrate will be processed, at the changed gas flow rate, by the testing substrate processing means.

According to the present invention, the processing system, the processing method and the computer program, which can readily control a gas flow rate, can be provided.

BRIEF DESCRIPTION OF THE DRAWINGS

FIG. 4 is a diagram showing an amount of film thickness for each zone under a process condition 1.

FIGS. 5(a), 5(b) are diagrams respectively showing the amount of film thickness for each zone under the process conditions 2, 3.

FIGS. 6(a), 6(b) are diagrams respectively showing the amount of film thickness for each zone under the process conditions 4, 5.

FIGS. 7(a), 7(b), 7(c), 7(d) are diagrams respectively illustrating a method of calculating a changing rate due to temperature change.

FIGS. 8(a), 8(b), 8(c) are diagrams respectively illustrating the changing rates due to change of the hydrogen partial pressure ratio, pressure change and change of the gas total flow rate.

FIG. 9 is a diagram illustrating a model indicative of a relationship between the film thickness and the flow rate.

FIG. 13(a), 13(b), 13(c), 13(d) are diagrams illustrating a method of calculating the decreased amount of the film thickness due to the loading effect.

DETAILED DESCRIPTION OF THE INVENTION

EXAMPLES

First Embodiment

Hereinafter, a first embodiment will be described, by way of example, in regard to the case in which the processing system, processing method and/or program, according to this invention, is applied to the batch-type vertical heating apparatus. In this embodiment, the present invention will be discussed, by way of example, with respect to the case in which a $SiO_2$ film is formed on each semiconductor wafer, by using a low pressure radical oxidation (LPRO) method employing $O_2$ gas and $H_2$ gas, as the processing method for providing a process to an object or objects to be processed.

Figure 1:
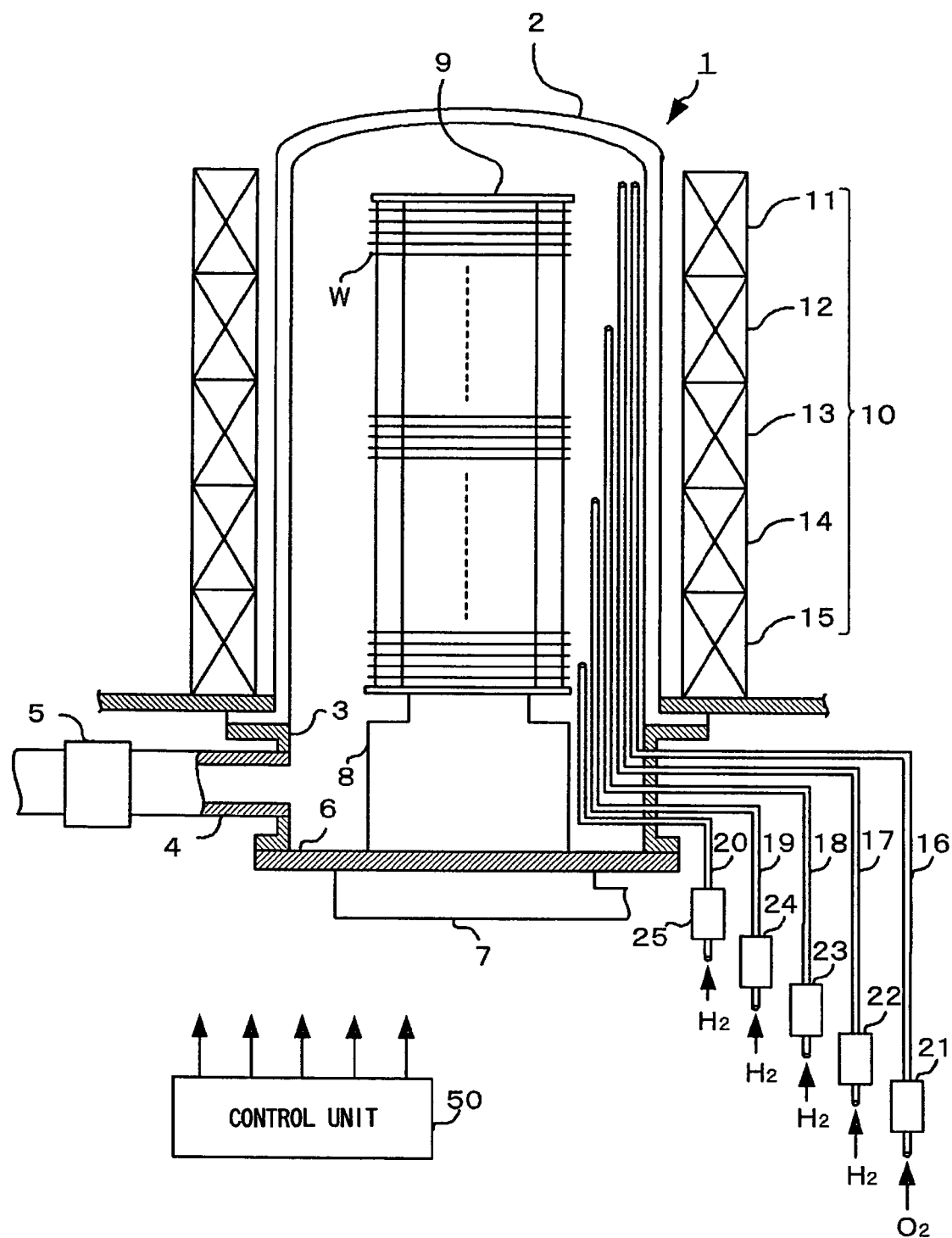
FIG. 1 is a view showing a structure of a heating apparatus related to a first embodiment of the present invention.

As shown in FIG. 1, the vertical-type heating apparatus 1 of this embodiment includes a substantially cylindrical reaction vessel 2 having a ceiling. The reaction vessel 2 is disposed such that its longitudinal direction is vertically directed. The reaction vessel 2 is formed from a material excellent in heat resistance and corrosion resistance, for example, quartz.

Under the reaction vessel 2, a substantially cylindrical manifold 3 is provided. The manifold 3 is airtightly joined, at its top end, to a bottom end of the reaction vessel 2. An exhaust pipe 4 for discharging gases from the interior of the reaction vessel 2 is airtightly joined to the manifold 3. A pressure control unit 5 composed of a valve, a vacuum pump and the like, is provided to the exhaust pipe 4, and serves to control pressure (or degree of vacuum) in the reaction vessel 2 to a desired level.

A cover 6 is located below the manifold 3 (or reaction vessel 2). The cover 6 is configured to be moved in the vertical direction by a boat elevator 7. With such configuration, when the cover 6 is elevated by the boat elevator 7, a bottom end opening (or furnace port) of the manifold 3 (or reaction vessel 2) will be closed, while when the cover 6 is lowered by the boat elevator 7, the bottom end opening (or furnace port) of the reaction vessel 2 will be opened.

A wafer boat 9 is provided on the cover 6 via a heat insulating mound (or heat insulating member) 8. The wafer boat 9 serves as a wafer holding tool adapted for receive (or hold) the objects to be processed, for example, semiconductor wafers W, therein. In this embodiment, the wafer boat 9 is configured to contain therein multiple sheets of, for example, 150 sheets of, semiconductor wafers W, in the vertical direction, with a predetermined gap. Thus, the semiconductor wafers W are contained in the wafer boat 9, and the cover 6 is then lifted up by the boat elevator 7, so that the semiconductor wafers W can be loaded in the reaction vessel 2.

Figure 3:
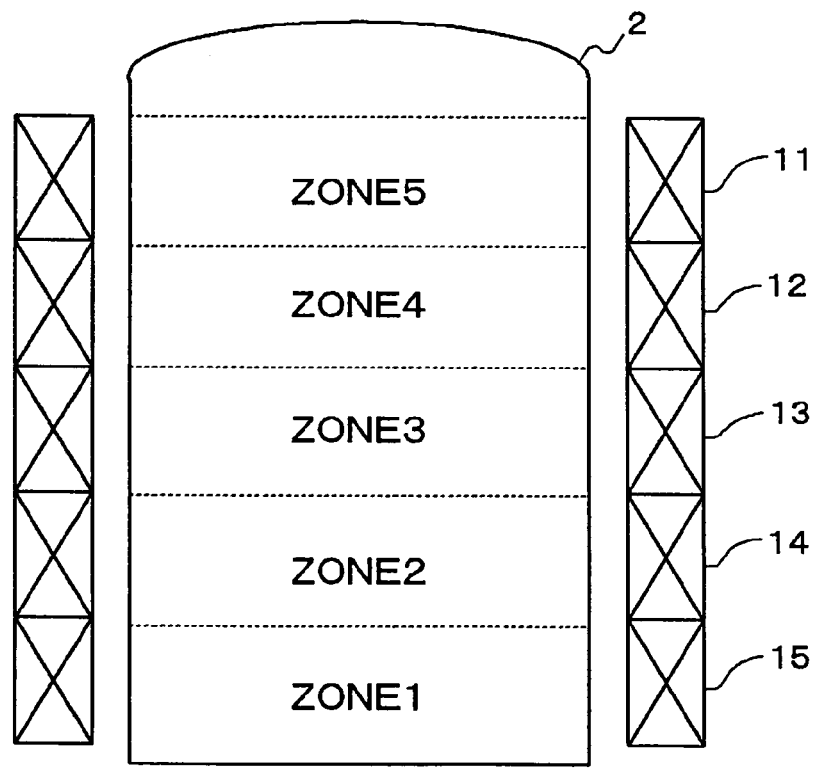
FIG. 3 is a view showing zones in a reaction vessel.

Around the reaction vessel 2, a heater unit 10 composed of, for example, resistance heating members, is provided to surround the reaction vessel 2. Due to this heater unit 10, the interior of the reaction vessel 2 can be heated up to a predetermined temperature, as such the semiconductor wafers W can also be heated to the predetermined temperature. The heater unit 10 includes heaters 11 to 15 arranged in, for example, five stages, wherein each heater 11 to 15 is independently supplied with electric power from each corresponding power controller (not shown). Accordingly, the interior of the reaction vessel 2 can be considered as divided into five zones by the heaters 11 to 15, as shown in FIG. 3.

To the manifold 3, a plurality of gas supply pipes, each adapted for supplying a gas into the reaction vessel 2, are provided. In this embodiment, an $O_2$ gas supply pipe 16 for supplying the $O_2$ gas into the reaction vessel 2, and four $H_2$ gas supply pipes 17 to 20 for supplying the $H_2$ gas into the reaction vessel 2 are provided. The $O_2$ gas supply pipe 16 is provided to extend along a side portion of the manifold 3 up to a position in the vicinity of an upper end of the wafer boat 9, in order to supply the $O_2$ gas into the reaction vessel 2 from the position in the vicinity of the upper end of the wafer boat 9. The $H_2$ gas supply pipes 17 to 20 are provided such that each distal end thereof has a different level, relative to one another, with a predetermined space. Namely, the respective distal ends (or levels) of the $H_2$ gas supply pipes 17 to 20 are positioned (or arranged) to be lowered with an equal interval.

In this example, the $H_2$ gas supply pipe 17 is provided to extend along the side portion of the manifold 3 up to the position in the vicinity of an upper end of the wafer boat 9, in order to supply the $H_2$ gas into the reaction vessel 2 from the position in the vicinity of the upper end of the wafer boat 9. The $H_2$ gas supply pipe 18 is provided to extend along the side portion of the manifold 3 up to a level approximately ⅔ of the height of the wafer boat 9, in order to supply the $H_2$ gas into the reaction vessel 2 from a position approximately ⅔ of the height of the wafer boat 9. The $H_2$ gas supply pipe 19 is provided to extend along the side portion of the manifold 3 up to a level approximately ⅓ of the height of the wafer boat 9, in order to supply the $H_2$ gas into the reaction vessel 2 from a position approximately ⅓ of the height of the wafer boat 9. The $H_2$ gas supply pipe 20 is provided to extend along the side portion of the manifold 3 up to a position in the vicinity of a lower end of the wafer boat 9, in order to supply the $H_2$ gas into the reaction vessel 2 from the position in the vicinity of the lower end of the wafer boat 9. In this embodiment, the $H_2$ gas supply pipe 17 is used as a main supply pipe for the $H_2$ gas, and the $H_2$ gas supply pipes 18 to 20 are used as sub-supply pipes for the $H_2$ gas.

To the respective gas supply pipes 16 to 20, flow rate control units 21 to 25, each composed of a mass flow controller (MFC) or the like for controlling each gas flow rate, are connected. Thus, a desired amount of gas controlled by each flow rate control unit 21 to 25 can be supplied into the reaction vessel 2 via each gas supply pipe 16 to 20.

Figure 2:
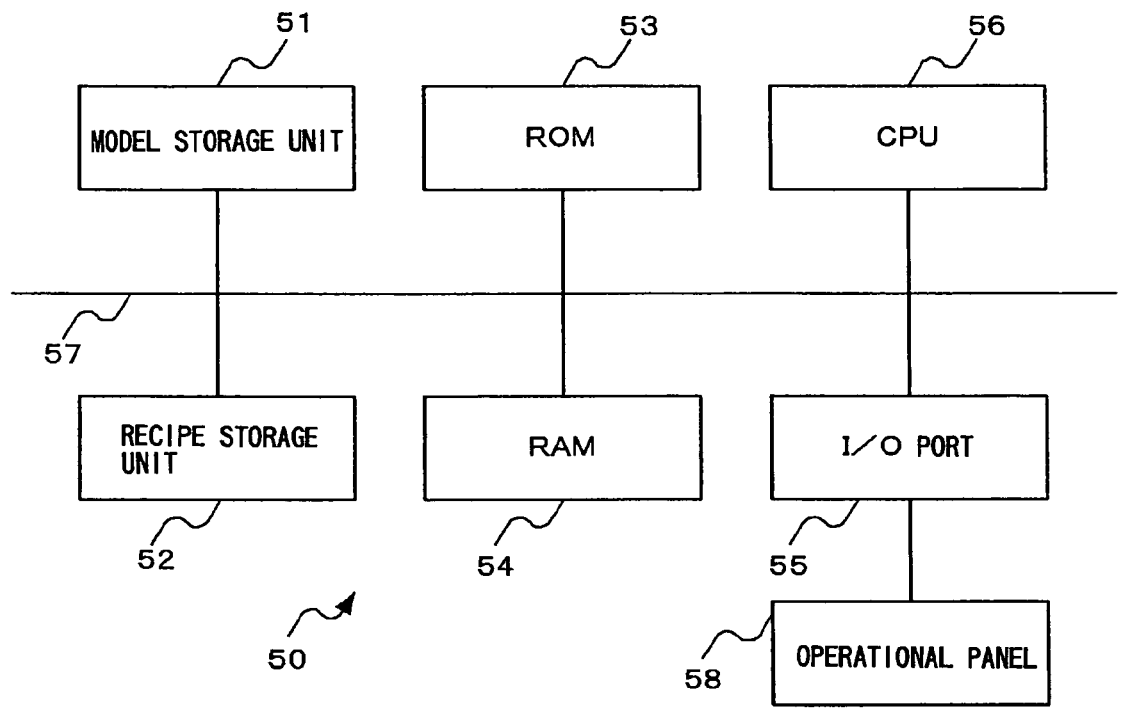
FIG. 2 is a block diagram showing one example of construction of a control unit shown in FIG. 1.

The vertical-type heating apparatus 1 includes a control unit (or controller) 50 for controlling processing parameters, such as gas flow rates, pressure and temperature of the processing atmosphere and the like, in the reaction vessel 2. The control unit 50 outputs control signals to the flow rate control units 21 to 25, pressure control unit 5, and power controllers (not shown), respectively. FIG. 2 shows construction of the control unit 50.

As shown in FIG. 2, the control unit 50 includes a model storage unit 51, a recipe storage unit 52, a ROM 53, a RAM 54, an I/O port 55, a CPU 56 and a bus 57 for connecting these units relative to one another.

In the model storage unit 51, a flow rate-process result-relationship model indicative of the flow rate of the processing gas and the process result is stored. In this embodiment, in the model storage unit 51, a film thickness-flow rate-relationship model indicative of the flow rate of each gas supplied from each gas supply pipe 16 to 20 and the film thickness provided on each semiconductor wafer W is stored. The film thickness-flow rate-relationship model is prepared based on the process result (or film thickness result), under two or more different conditions, with respect to the temperature, pressure, gas total flow rate and the like, in the reaction vessel 2, these elements or factors being respectively constituting the processing conditions. Therefore, the film thickness-flow rate-relationship model can be adapted (or interpolated) relative to changes of the processing conditions, and can be used for calculating the flow rate of the gas supplied from each gas supply pipe 16 to 20, base on the processing conditions, such as the temperature, pressure and gas total flow rate and the like, in the reaction vessel 2, as well as on the film thickness required. The film thickness-flow rate-relationship model will be detailed later.

In the recipe storage unit 52, processing recipes designating each controlling procedure are stored, corresponding to kinds of the film forming process performed by the heating apparatus. Each processing recipe is prepared for each process actually performed by an operator or user, and prescribes therein temperature change of each part, pressure change in the reaction vessel 2, timing of start and stop of supply of each gas, a supply amount of each gas and the like, during a period of time from loading the semiconductor wafers W into the reaction vessel 2 to unloading the processed semiconductor wafers W therefrom.

The ROM 53 is composed of, an EEPROM, a flash memory, a hard disk or the like, and serves as a storage medium for storing operational programs of the CPU 56 and the like therein.

The RAM 54 functions as a working area for the CPU 56.

The I/O port 55 supplies measured signals related to the temperature, pressure and gas flow rates to the CPU 56 and outputs control signals outputted from the CPU 56 to the respective units (e.g., the power controllers, flow rate control units 21 to 25 and pressure control unit 5). An operation panel 58, by which the operator can operate the vertical-type heating apparatus 1, is connected with the I/O port 55.

The CPU (Central Processing Unit) 56 constitutes a main part of the control unit 50, and is configured to execute the operational program stored in the ROM 53, so as to control the operation of the vertical-type heating apparatus 1, in accordance with each processing recipe stored in the recipe storage unit 52, based on an instruction from the operational panel 58.

Additionally, the CPU 56 calculates an appropriate flow rate of the gas supplied from each gas supply pipe 16 to 20, based on the film thickness result obtained from the film formed on each semiconductor wafer W and the film thickness-flow rate-relationship model stored in the model storage unit 51. Then, the CPU 56 outputs the control signal to each flow rate control unit 21 to 25, such that the flow rate of the gas supplied from each gas supply pipe 16 to 20 will be each calculated flow rate. Furthermore, the CPU 56 updates the flow rate of the gas in each corresponding recipe stored in the recipe storage unit 52 by the calculated gas flow rate. Namely, the CPU 56 performs an update operation for each recipe based on the film thickness result provided on each semiconductor wafer W.

The bus 57 transmits information between the respective units.

Next, the film thickness-flow rate-relationship model stored in the model storage unit 51 will be described. The film thickness-flow rate-relationship model is indicative of a relationship between the flow rate of the gas supplied from each gas supply pipe 16 to 20 and a changing amount of the film thickness provided on each semiconductor wafer W, and it can be prepared based on experiments under a plurality of processing conditions. Hereinafter, a method of preparing the film thickness-flow rate-relationship model will be described.

First, as shown in FIG. 4, the $SiO_2$ film was formed on each semiconductor wafers W, in the case in which the flow rate of each $H_2$ gas supply pipe 18 to 20 (or sub-supply pipe 1 to 3 for the $H_2$ gas) was changed (as described by each condition 1-1 to 1-4), under a predetermined processing condition, for example, a process condition 1 (i.e., the temperature in the reaction vessel 2: 900° C.; the hydrogen partial pressure ratio: 10%; the pressure: 0.3 Torr (40 Pa); and the gas total flow rate: 5000 sccm). Thereafter, the semiconductor wafers W contained in each zone 1 to 5 of the reaction vessel 2 as shown in FIG. 3 were taken out, and the film thickness of $SiO_2$ formed on each taken out semiconductor wafer W was then measured.

Subsequently, as shown in FIGS. 5 and 6, similar tests were performed while changing a part of the processing condition, so as to measure the film thickness of $SiO_2$ formed on each semiconductor wafer W for each zone 1 to 5. In these tests, the temperature in the reaction vessel 2 was changed into 800° C. under a process condition 2, the hydrogen partial pressure ratio was changed into 5% under a process condition 3, the pressure was changed into 0.5 Torr (67 Pa) under a process condition 4, and the gas total flow rate was changed into 3500 sccm under a process condition 5.

Then, the film thickness data was interpolated for each changed process condition, so as to calculate the film thickness in a recipe condition to be obtained. In this example, a case, in which the processing condition of the recipe to be obtained includes the temperature in the reaction vessel 2: 850° C.; the hydrogen partial pressure ratio: 18.4%; the pressure: 0.4 Torr (53 Pa); and the gas total flow rate: 4655 sccm, will be described by way of example.

First, the film thickness data related to the temperature in the reaction vessel 2 was interpolated. In this example, the film thickness of $SiO_2$ formed on each semiconductor wafer W when the temperature in the reaction vessel 2 would satisfy the recipe condition, i.e., 850° C., was calculated (or interpolated), from the film thickness (or reference film thickness) of $SiO_2$ formed on each semiconductor wafer W in each zone 1 to 5 when the temperature in the reaction vessel 2 was 900° C. as shown in FIG. 7(a) as well as from the film thickness (or changed film thickness) of $SiO_2$ formed on each semiconductor wafer W in each zone 1 to 5 when the temperature in the reaction vessel 2 was 800° C. as shown in FIG. 7(b).

As a method for the interpolation, various methods can be used. In this example, however, the film thickness (i.e., the interpolated film thickness) of $SiO_2$ formed on each semiconductor wafer W in each zone 1 to 5 when the temperature in the reaction vessel 2 would be 850° C. was calculated by the so-called power law approximation (i.e., the thickness=$aT^b$). FIG. 7(*c*) shows each interpolated film thickness.

Subsequently, a changing rate due to temperature change in the reaction vessel 2 was calculated from each value of the interpolated film thicknesses. In this example, the changing rate due to the temperature change was calculated by an equation: the changing rate=(the interpolated film thickness−the reference film thickness)/the reference film thickness. FIG. 7(*d*) shows the changing rate due to the temperature change.

In addition, the changing rates due to change of the hydrogen partial pressure ratio, pressure change and change of the gas total flow rate were also calculated, with respect to the hydrogen partial pressure ratio, the pressure and the gas total flow rate, in the same procedure, by the interpolation of the film thickness data. FIG. 8(*a*) shows the changing rate due to the change of the hydrogen partial pressure ratio, FIG. 8(*b*) shows the changing rate due to the pressure change, and FIG. 8(*c*) shows the changing rate due to the change of the gas total flow rate.

Thereafter, by adding these changed factors of the process condition, or by calculating a formula: (the reference film thickness)×(1+the changing rate due to the temperature change+the changing rate due to the change of the hydrogen partial pressure ratio+the changing rate due to the pressure change+the changing rate due to the change of the gal total flow rate), a relationship between the gas flow rate and the changing amount of the film thickness corresponding to the recipe to be calculated can be obtained, thereby preparing the film thickness-flow rate-relationship model.

The film thickness-flow rate-relationship model can be expressed by an equation: $y=Mu$. In this equation, $y=[y(1), y(2), \ldots, y(n)]^T$ is the changing amount of the film thickness, $u=[u(1), u(2), \ldots, u(n)]^T$ is the changing amount of the gas flow rate, and $M(n\times m)$ is a conversion matrix for conversion between the changing amount of the film thickness and the changing amount of the gas flow rate. In fact, however, the film thickness-flow rate-relationship model includes error factors, such as structural differences, differences in the modeling mode, measurement errors and the like. Thus, it is generally expressed by an equation: $y=Mu+x$, in which the term $x=[x(1), x(2), \ldots, x(n)]^T$ is added to the original equation ($y=Mu$) in order to correct the above errors together. In this case, x is first estimated by using a Kalman filter, and then an estimated value of the film thickness y corresponding to u is obtained. Consequently, the changing amount of the gas flow rate can be obtained such that a difference between the estimated value and a targeted value will be cancelled or eliminated. Since there is some restriction in actual calculation for the gas flow rate, it is preferred to obtain the gas flow rate, for example, by using the so-called quadratic programming method.

As described above, for the film thickness-flow rate-relationship model, there is no need to formularize physical phenomena. Therefore, a highly precise model can be obtained with ease. Additionally, even in the case in which the processing condition, such as the temperature, pressure, gas total flow rate and/or the like, is changed, a significantly precise film thickness-flow rate-relationship model can be prepared by the interpolation of a linear model prepared in advance. Accordingly, even through the process condition, such as the temperature, pressure, gas total flow rate and/or the like, is changed, there would be no need to prepare the film thickness-flow rate-relationship model from a new experiment.

Figure 10:
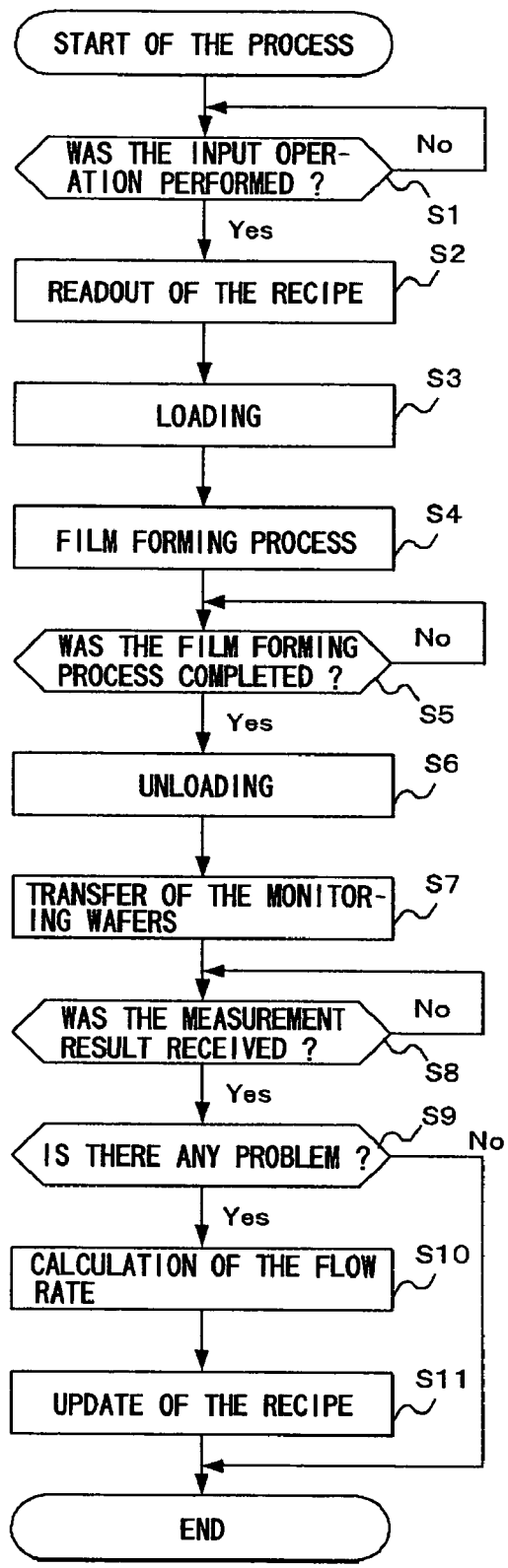
FIG. 10 is a flow chart for illustrating a procedure of a process of the first embodiment.

Next, the processing method of this invention will be discussed, with reference to FIG. 10, by way of example, in regard to a film forming method in which an oxidized film is formed on each semiconductor wafer W by using the vertical-type heating apparatus 1 constructed as described above.

First, an operator inputs details of a process (or conditions for forming the oxidized film) into the operational panel 58. Then, the CPU 56 discriminates whether or not the input operation was performed (step S1). If the input operation was performed (i.e., "Yes" in the step S1), the CPU 56 will read out a recipe, for forming the oxidized film corresponding to an inputted instruction (or details of the process), from the recipe storage unit 52 (step S2).

Thereafter, the CPU 56 sets the temperature in the reaction vessel 2 at a loading temperature, e.g., 400° C., fixed in advance in the recipe, by using the heater unit 10, places a predetermined number of sheets, for example, 150 sheets, of semiconductor wafers W, i.e., objects to be processed, in the wafer boat 9, and elevates the cover 6 by actuating the boat elevator 7. In this way, the CPU 56 brings a flange of the bottom end of the manifold 3 and the cover 6 together into an airtight contact state, as such loading the semiconductor wafers W into the reaction vessel 2 (step S3).

Once the loading of the semiconductor wafers W is completed, the CPU 56 sets the interior of the reaction vessel 2 at a film forming condition in accordance with the read out recipe. More specifically, the CPU 56 controls an exhaust system including the pressure control unit 5, so as to start evacuating operation. At the same time, the CPU 56 starts temperature rising by increasing electric power supplied to the heater unit 10. In addition, the CPU 56 controls the flow rate control units 21 to 25, so as to supply the predetermined amounts of processing gasses into the reaction vessel 2 from the gas supply pipes 16 to 20, respectively, thereby performing the film forming process (step S4).

Subsequently, the CPU 56 discriminates whether or not the film forming process was completed (step S5). If the film forming process was completed (i.e., "Yes" in the step S5), the CPU 56 stops the supply of the processing gases. Then, the CPU 56 makes the interior of the reaction vessel 2 cooler, and sets it at an unloading temperature, e.g., 400° C., fixed in advance in the recipe, as such unloading the wafer boat 9 (or semiconductor wafers W) (step S6).

Thereafter, the CPU 56 makes at least one sheet of semiconductor wafer W (or monitoring wafer) taken out, for each zone 1 to 5, from the semiconductor wafers W placed in the unloaded wafer boat 9, and transfers the monitoring wafers to a measuring unit (not shown) (step S7).

Once the film thickness of each monitoring wafer has been measured by the measuring unit, measurement result information about a result of measuring the film thickness of the monitor wafer is transmitted from the measuring unit to the vertical-type heating apparatus 1 (or CPU 56). Then, the CPU 56 discriminates whether or not it received the measurement result information (step S8). If it received the measurement result information (i.e., "Yes" in the step S8), the CPU 56 further discriminates whether or not there is a problem in the film thickness of the formed $SiO_2$ film (step S9). If there is no problem (i.e., "No" in the step S9), the CPU 56 will stop this process.

Contrary, if there is a problem (i.e., "Yes" in the step S9), the CPU 56 calculates the flow rate of the processing gas supplied from each gas supply pipe 16 to 20 for a next film forming process, based on the measurement result information (i.e., the measured film thickness of each monitoring wafer) and the film thickness-flow rate-relationship model stored in the model storage unit 51 (step S10). Namely, by obtaining the changing amount of the gas flow rate for cancelling or eliminating the difference between the film thickness of each measured monitoring wafer and the targeted film thickness by using the film thickness-flow rate-relationship model, the flow rate of the processing gas supplied from each gas supply pipe 16 to 20 for the next film forming process can be calculated.

After calculating the flow rate of the processing gas supplied from each gas supply pipe 16 to 20, the CPU 56 stores the calculated flow rate of each processing gas in the RAM 54 as the flow rate of each processing gas for the next film forming process, so as to update the recipe (step S11). It should be appreciated that the operator may update the recipe, by inputting the calculated flow rate of each processing gas as the flow rate of each processing gas for the next film forming process, via the operational panel 58.

As described above, according to this embodiment, since the flow rate of the processing gas supplied from each gas supply pipe 16 to 20 for the next film forming process can be calculated based on the film thickness of the semiconductor wafers W (or monitoring wafers) each having been subjected to the film forming process as well as on the film thickness-flow rate-relationship model, the gas flow rate can be readily controlled. Moreover, since the flow rate of each processing gas can be controlled by using the result (or film thickness) of the film forming process of the last session, the film forming process which can provide a significantly appropriate film thickness can be achieved, regardless of occurrence of the change over time of the apparatus and/or change of the film forming environment (i.e., the external temperature, atmospheric pressure and the like).

Second Embodiment

In the first embodiment, the present invention has been described, by way of example, in regard to the case in which the flow rate of each processing gas is controlled in the film forming process for the semiconductor wafers W (or manufactured wafers).

In the second embodiment, the present invention will be described, by way of example, with respect to the case in which the film forming condition is first checked by using a testing substrate or substrates, i.e., a dummy wafer or wafers, and the film forming process is then provided to the manufactured wafers (i.e., the semiconductor wafers W) under the checked film forming condition. The reason for checking the film forming condition by using such a dummy wafer or wafers is that the manufactured wafers are quite expensive, and that the pattern of each manufactured wafer is likely to be collapsed when the same manufactured wafer is repeatedly used for the checking operation, as such making it difficult to obtain a great number of experimental data through such operation.

However, in the case of checking the film forming condition by using the dummy wafers, an error in the process result attributable to a difference between each dummy wafer and each manufactured wafer, for example, the difference in the film thickness, may tend to occur due to a loading effect. Additionally, even if formed under the same condition, the film formed on the dummy wafer is likely to be thicker than that formed on the manufactured wafer. Therefore, in the processing method of the second embodiment, a targeted film thickness of the dummy wafer corresponding to the targeted film thickness of the manufactured wafer is determined, by using a loading effect data base as described later, taking into account the problem on the difference in the film thickness caused by the loading effect. Consequently, the gas flow rate that can correspond to the determined targeted film thickness will be determined in the same manner as in the first embodiment.

Therefore, the second embodiment is different from the first embodiment, in that the loading effect data base 100 is further provided in the control unit 50 of the first embodiment. Herein after, description centered on a point different from the first embodiment will be provided.

Figures 11, 12:
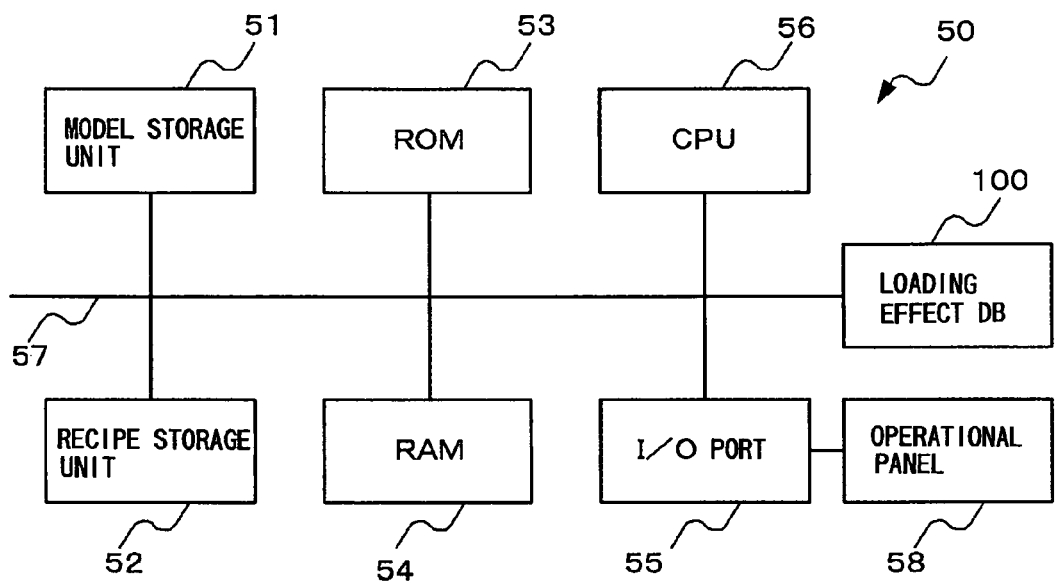
FIG. 11 is a block diagram showing one example of the construction of the control unit of the first embodiment.
FIG. 12 is a diagram showing a decreased amount of the film thickness due to a loading effect.

FIG. 11 shows construction of the control unit 50 of the second embodiment. As shown in FIG. 11, the control unit 50 includes the model storage unit 51, the recipe storage unit 52, the ROM 53, the RAM 54, the I/O port 55, the CPU 56, and the loading effect data base 100, wherein these units are connected, via the bus 57, relative to one another.

The loading effect data base 100, for example, as shown in FIG. 12, stores therein a film-thickness difference (or film-thickness decreased amount) due to a difference in the loading effect between the dummy wafer and the manufactured wafer in each zone. For instance, in the case in which the targeted film thickness in the zone 1 with respect to bare Si (or silicon) is 80 Å, the targeted film thickness of the dummy wafer will be 85.08 Å. Hereinafter, a method of preparing the loading effect data base 100 will be described.

In order to estimate the loading effect, film thickness data of the dummy wafers and that of the manufactured wafers are required. However, since the manufactured wafers are relatively expensive, and the pattern of each wafer will be collapsed if the same manufactured wafer is used many times for the estimation, it is difficult to obtain a great number of experimental data from such estimation. To address this problem, in this embodiment, a case, in which the film-thickness difference between the dummy wafer and the manufactured wafer is calculated from data obtained by a simulator so as to estimate the loading effect under various processing conditions, will be discussed.

Temperature dependency of the film thickness of the oxidized film can be approximated by the following equation (1).

$$x^2 - d_0^2 = Bt \tag{1}$$

In the equation (1), x is the film thickness, t is time, B is a coefficient of secondary oxidation, and $d_0$ is an initial oxidized film thickness when the time is zero.

The secondary oxidation coefficient B can be expressed by the following equation (2).

$$B = 2DC_0/C_1 \tag{2}$$

In the equation (2), D is a diffusion coefficient, $C_0$ is a surface concentration of oxidized matter, and $C_1$ is a concentration of the oxidized matter in the oxidized film.

Of these values, the initial oxidized film $d_0$ can be experimentally obtained. The concentration $C_1$ of the oxidized matter in the oxidized film can be considered to be constant relative to the oxidized matter, and the diffusion coefficient D depends on the temperature and can be approximated linearly. Thus, the secondary oxidation coefficient B will be proportional to the concentration $C_0$, and can be expressed by the following equation (3).

$$B = \alpha C_0 \tag{3}$$

A proportionality factor α can be experimentally obtained for each temperature zone. For example, α can be obtained, as a value at a predetermined temperature, by linear approximation, from a relationship between the temperature and α, as shown in FIG. 13(*a*). The surface concentration (or oxygen radical concentration) $C_0$ can be calculated by using a simulator. For example, in the case of the recipe as shown in FIG. 13(b), the oxygen radical concentration $C_0$ of each zone will be a value as shown in FIG. 13(c). However, a difference in the concentration of the oxidized matter will be seen due to differences of kinds of the film and surface area of each wafer surface. Therefore, in this example, as shown in FIGS. 12 and 13, the film-thickness decreased amount due to the loading effect was calculated in two cases, i.e., in the case of the bare Si and in the case of five times the pattern surface area.

Since the secondary oxidation coefficient B can be obtained from the proportionality factor α and the surface concentration $C_0$ of the oxidized matter, the film thickness x can be expressed by the following equation (4) by using the equations (1) and (3).

$$x = (\alpha \times C_0 \times t + d_0^2)^{0.5} \quad (4)$$

For instance, the value of α at 850° C. shown in the recipe of FIG. 13(b) will be 120, if linearly approximated from the relationship shown in FIG. 13(a). Accordingly, if the experimentally obtained initial oxidized film thickness is 27 Å and the process time is 15 minutes (900 seconds), the film thickness x, in each case of the SiO2 dummy wafer, the bare Si and five times the pattern surface area, will be obtained as shown in FIG. 13(d), from the equation (4). Thus, the film-thickness decreased amount due to the loading effect will be each value as shown in FIG. 12.

By carrying out the above calculation with respect to several points in the wafer boat (or boat positions), distribution of the film thickness in a direction between faces of wafers adjacent to one another can be obtained.

Figure 14:
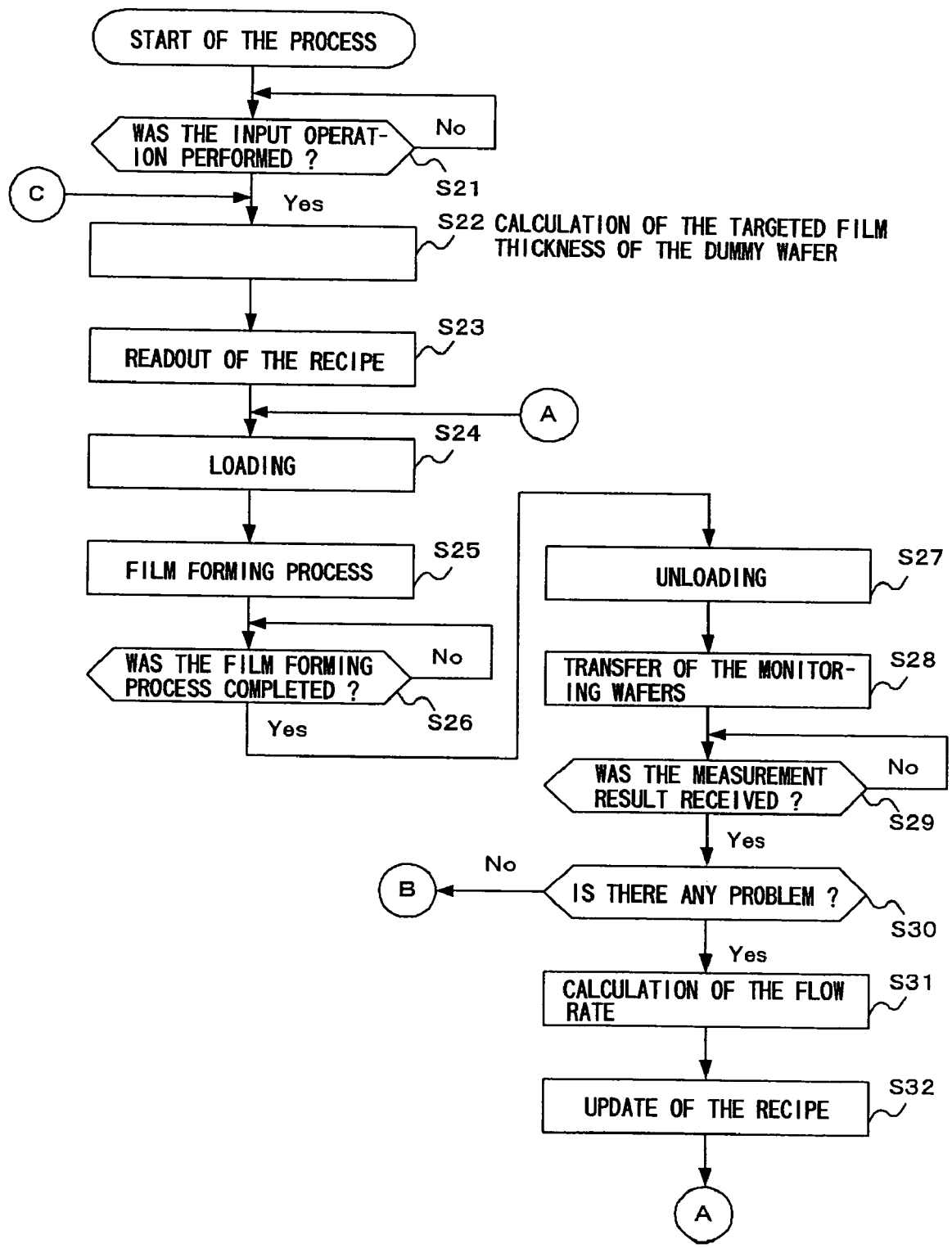
FIG. 14 is a flow chart for illustrating the procedure of the process of a second embodiment.
Figure 15:
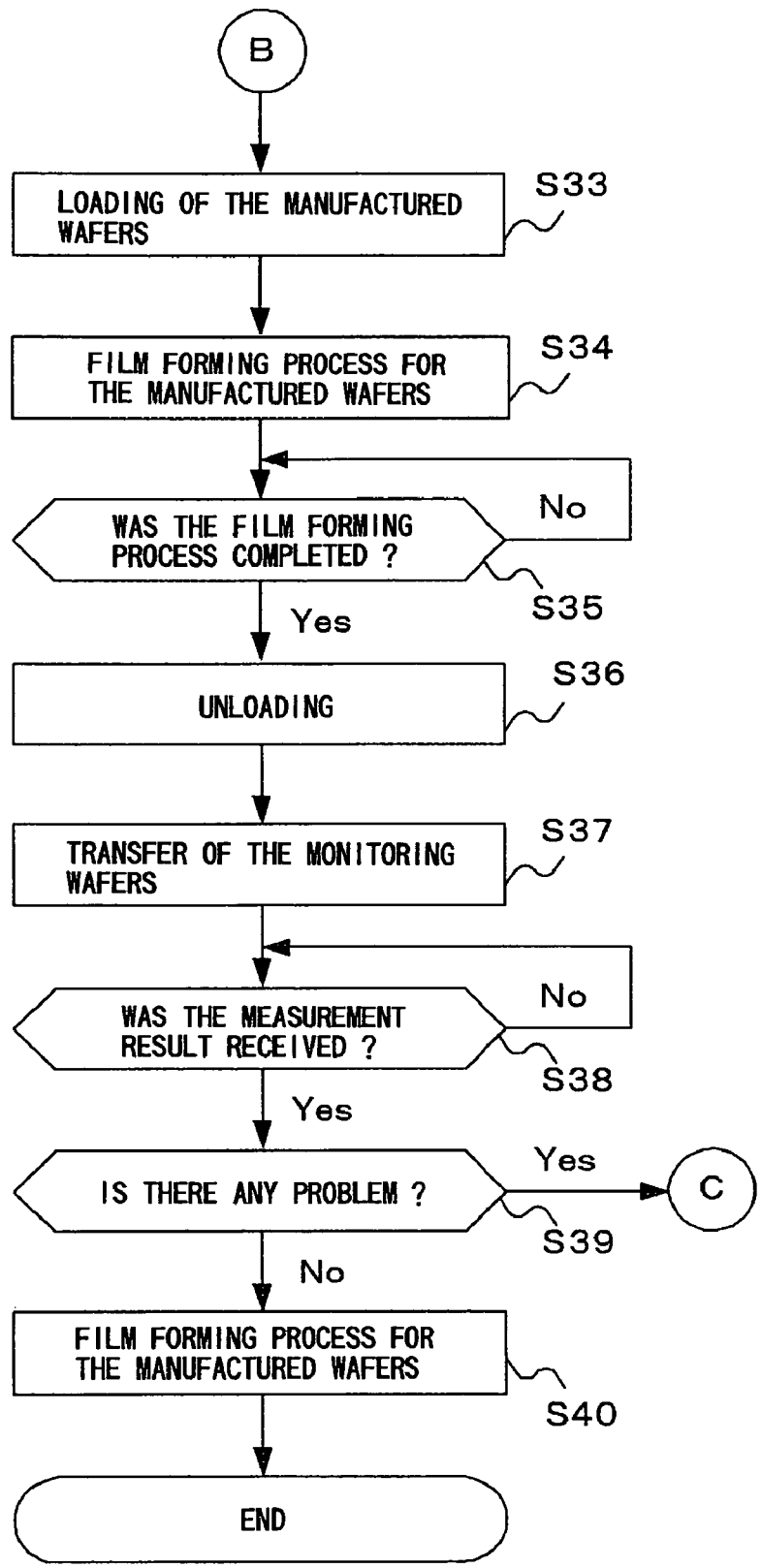
FIG. 15 is a flow chart for illustrating the procedure of the process of the second embodiment.

Next, the processing method of the present invention will be described, by way of example, with reference to FIGS. 14, 15, in regard to the case in which the film forming condition is first checked by using the dummy wafer or wafers and then the film forming process is provided to the manufactured wafers (or semiconductor wafers W) under the checked condition.

First, the operator inputs details of a process (or conditions for forming the oxidized film) and the targeted film thickness of the manufactured wafers into the operational panel 58. Then, the CPU 56 discriminates whether or not the input operation was performed (step S21). If the input operation was performed (i.e., "Yes" in the step S21), the CPU 56 calculates the targeted film thickness on the dummy wafer (step S22) and reads out the recipe, for forming the oxidized film corresponding to the inputted instruction, from the recipe storage unit 52 (step S23).

Thereafter, the CPU 56 sets the temperature in the reaction vessel 2 at the loading temperature fixed in advance in the recipe, by using the heater unit 10, places at least one sheet of dummy wafer, for each zone 1 to 5, in the wafer boat 9, and elevates the cover 6 by actuating the boat elevator 7. Consequently, the CPU 56 brings the flange of the bottom end of the manifold 3 and the cover 6 together into an airtight contact state, as such loading the dummy wafers into the reaction vessel 2 (step S24).

Once the loading of the dummy wafers is completed, the CPU 56 sets the interior of the reaction vessel 2 at the film forming condition in accordance with the read out recipe. Additionally, in accordance with the recipe, the CPU 56 controls the flow rate control units 21 to 25, so as to supply the predetermined amounts of processing gasses into the reaction vessel 2 from the gas supply pipes 16 to 20, respectively, thereby performing the film forming process (step S25). Subsequently, the CPU 56 discriminates whether or not the film forming process was completed (step S26). If the film forming process was completed (i.e., "Yes" in the step S26), the CPU 56 stops the supply of the processing gases. Then, the CPU 56 makes the interior of the reaction vessel 2 cooler, and sets it at the unloading temperature fixed in advance in the recipe, as such unloading the dummy wafers (step S27).

Thereafter, the CPU 56 makes the dummy or monitoring wafers taken out, and transferred to the measuring unit (not shown) (step S28). Once the film thickness of each monitoring wafer has been measured by the measuring unit, the measurement result information about the result of measuring the film thickness of each monitoring wafer is transmitted from the measuring unit to the vertical-type heating apparatus 1 (or CPU 56). Then, the CPU 56 discriminates whether or not it received the measurement result information (step S29), and further discriminates whether or not there is a problem in the film thickness (step S30). For instance, the discrimination whether or not there is a problem in the film thickness is carried out by discriminating whether or not the measurement result is within a predetermined range relative to the targeted film thickness of the dummy wafers.

If there is a problem (i.e., "Yes" in the step S30), the CPU 56 calculates the flow rate of the processing gas supplied from each gas supply pipe 16 to 20 for a next film forming process, based on the measured film thickness of the monitoring wafers as well as on the film thickness-flow rate-relationship model stored in the model storage unit 51 (step S31). Thereafter, the CPU 56 stores the calculated flow rate into the RAM 54 as the flow rate of each processing gas for the next film forming process, so as to update the recipe (step S32). Then, it returns to the step S24. Namely, the film forming process provided to the dummy wafers is performed again by using the updated recipe.

If there is no problem (i.e., "No" in the step S30), the CPU 56 makes the manufactured wafers (or semiconductor wafers W) placed on the wafer boat 9, so as to load the manufactured wafers in the reaction vessel 2 (step S33). Then, it performs the film forming process for the manufactured wafers in accordance with the recipe (step S34). Subsequently, the CPU 56 discriminates whether or not the film forming process was completed (step S35). If the film forming process was completed (i.e., "Yes" in the step S35), the CPU 56 unloads the manufactured wafers in accordance with the recipe (step S36).

Thereafter, the CPU 56 makes the monitoring wafers taken out, and transferred to a measuring unit (not shown) (step S37). Then, the CPU 56 discriminates whether or not it received the measurement result information (step S38), and further discriminates whether or not there is a problem in the film thickness (step S39).

If there is a problem (i.e., "Yes" in the step S39), the CPU 56 will return to the step S22. Namely, the targeted film thickness of the dummy wafer is calculated again, and a preferable recipe is selected again (or a preferable gas flow rate is calculated again).

If there is no problem (i.e., "No" in the step S39), the film forming process will be provided to the manufactured wafers in the same manner as in the first embodiment, so as to form the $SiO_2$ film on each semiconductor wafer W (step S40).

Figure 16:
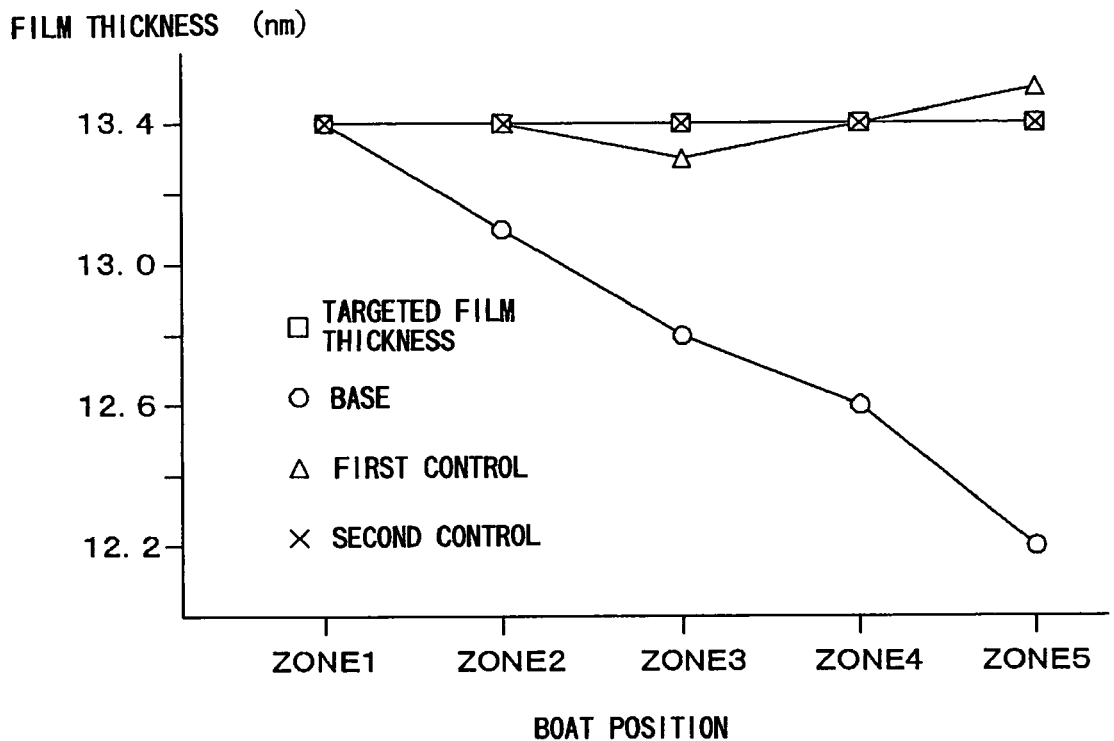
FIG. 16 is a diagram showing a result obtained from controlling the gas flow rate in the case of using a dummy wafer.
Figure 17:
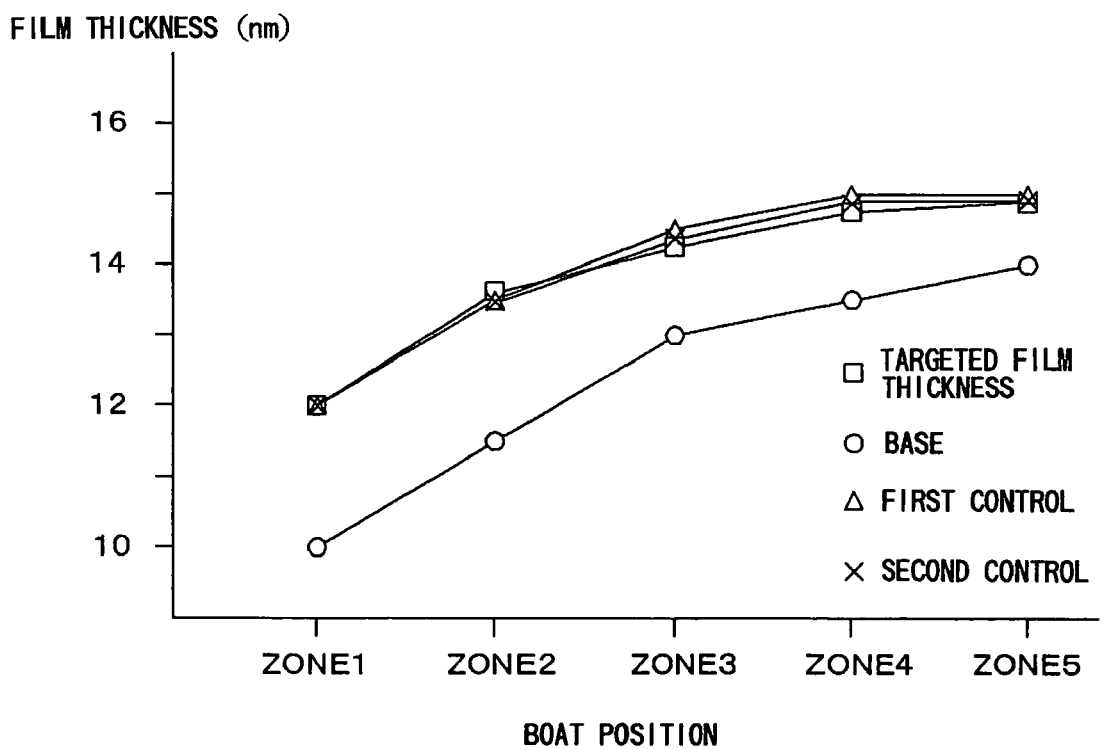
FIG. 17 is a diagram showing a result obtained from controlling the gas flow rate in the case of using the dummy wafer.

FIGS. 16 and 17 show results obtained from the control of the gas flow rate due to the dummy wafer, respectively. FIG. 16 shows a case in which the targeted film thickness is constant irrespectively of the boat positions, while FIG. 17 shows a case in which the targeted film thickness varies with the boat positions. As shown in FIG. 16, in the case in which the targeted film thickness is constant irrespectively of the boat positions, the film thickness was coincident with the targeted film thickness after controlled twice. In addition, while variation of in-plane uniformity was about ±4.39% at the start of operation, it was improved up to ±0.26% after controlled twice. Similarly, as shown in FIG. 17, the film thickness was coincident with the targeted film thickness after the control, even in the case in which the targeted film thickness varies with the boat positions.

As described above, according to this embodiment, as is similar to the first embodiment, the gas flow rate can be readily controlled.

It should be appreciated that the present invention is not limited to the above embodiments, and various modifications and applications can be made thereto. Hereinafter, other embodiments applicable to this invention will be described.

In the above embodiments, the present invention has been described, by way of example, with respect to the film thickness-flow rate-relationship model that can be adapted for the change of the temperature, pressure, gas total flow rate and/or hydrogen partial pressure ratio, in the reaction vessel 2. However, the film thickness-flow rate-relationship model may also be adapted for changes of other processing conditions than those described above. Alternatively, the film thickness-flow rate-relationship model may be adapted for only the change of the temperature in the reaction vessel 2, but more preferably, it can be adapted for the change of at least two of the above conditions.

In the above embodiments, the present invention has been described, by way of example, with respect to the loading effect as the information concerning the film-thickness difference attributable to the difference between the semiconductor wafer W and the dummy wafer. However, other effects or factors may also be employed, provided that the film-thickness difference attributable to the difference between both of the wafers can be greater or more conspicuous due to such factors.

In the above embodiments, the present invention has been described, by way of example, with regard to the heating apparatus for forming the oxidized film. The kind of the process can be optionally selected, and thus the present invention can be applied to other various batch-type heating apparatuses, such as CVD apparatuses, nitrification apparatuses, etching apparatuses and the like, which can be employed for forming other kinds of films. In such a case, the flow rate-process result-relationship model corresponding to each kind of the process is stored in the model storage unit 51 of the control unit 50.

In the above embodiments, the present invention has been described, by way of example, with respect to the case in which the four $H_2$ gas supply pipes 17 to 20 are provided. However, the number of the $H_2$ gas supply pipes may not be plural. Even in such a case, the gas flow rate can also be optimally controlled with ease. However, with the plurality of $H_2$ gas supply pipes provided, the $H_2$ gas in the reaction vessel 2 can be supplied more uniformly. Therefore, it is preferred that the $H_2$ gas supply pipes are provided in a plural number.

In the above embodiment, the present invention has been described, by way of example, in regard to the case in which the single $O_2$ gas supply pipe 16 is provided. For example, multiple $O_2$ gas supply pipes may be provided, such that these $O_2$ gas supply pipes extending along a side portion of the manifold 3 up to a position in the vicinity of a lower end of the wafer boat 9 are added alternatively or additionally.

In the above embodiment, the present invention has been described, by way of example, with respect to the case in which the flow rate of each processing gas is controlled without changing the temperature condition of each semiconductor wafer W. The flow rate control may be combined with any other various controlling methods. For example, the plurality of heaters 11 to 15 may be first driven independently in order to make the temperature of the semiconductor wafers W in each zone coincident with a predetermined temperature, and then, corresponding to the result of the film forming process, the predetermined temperature of the semiconductor wafers W may be further controlled. Alternatively or additionally, a film thickness-temperature relationship model, which is similar to the film thickness-flow rate-relationship model, may also be stored in the model storage unit 51, so as to finely control the film thickness by using this film thickness-temperature relation model.

In the above embodiments, the present invention has been described, by way of example, in regard to the batch-type heating apparatus having a single vessel structure. However, the present invention may also be applied to the batch-type heating apparatus having, for example, a double vessel structure, in which the reaction vessel 2 is composed of an inner vessel and an outer vessel.

In the above embodiments, the present invention has been described, by way of example, with respect to the case of controlling the film thickness of the film formed by the film forming process. However, the present invention is also effective for normalizing results of various processes, such as a diffusive concentration and/or diffusive depth in the impurity diffusion process, an etching grade, reflectance, implantation characteristics, step coverage and the like.

It should be noted that the number of the stages of the heaters (or number of the zones), the number of monitoring wafers extracted from each zone, and the like, can be set optionally.

The present invention is not limited to the process for the semiconductor wafers, but it may also be applied to, for example, a process for PDP substrates, glass substrates or the like.

The control unit 50 related to the above embodiments of this invention can be achieved by using a usual computer system without employing any special system for exclusive use. For example, the control unit 50 for performing the aforementioned process can be constructed, by installing a program or programs for executing the process as described above, into a general purpose computer, from a storage medium (e.g., a flexible disk, a CD-ROM or the like) storing them therein.

A means for providing these programs can be optionally selected. Namely, rather than providing them via the predetermined storage medium as described above, they may be provided via other media, for example, communication lines, communication networks, communication systems and the like. In such a case, for example, these programs may be put up on a bulletin board system (BBS) of the communication network, and then provided via the network while being superimposed into a carrier wave. Thereafter, the process described above can be performed, by starting the programs provided as described above and executing them in the same manner as the other application programs, under control of an OS.

The invention claimed is:

1. A processing system comprising:
a processing chamber adapted for containing therein an object to be processed or a testing substrate for the object to be processed;
a processing gas supply means adapted for supplying a processing gas into the processing chamber;
a processing condition storage means adapted for storing therein processing conditions corresponding to details of a process, the processing conditions including a flow rate of the processing gas supplied from the processing gas supply means;

an error information storage means adapted for storing therein error information about an error of a process result attributable to a difference between the object to be processed and the testing substrate;

a model storage means adapted for storing therein a flow rate-process result-relationship model indicative of a relationship between the flow rate of the processing gas and the process result;

a processing condition extracting means adapted for calculating a targeted process result of the testing substrate from a targeted process result of the object to be processed, based on the error information stored in the error information storage means, as well as adapted for extracting the processing conditions corresponding to the calculated targeted process result of the testing substrate, from the processing conditions stored in the processing condition storage means;

a testing substrate processing means adapted for processing the testing substrate under the processing conditions extracted by the processing condition extracting means;

a discriminating means adapted for discriminating whether or not the process result obtained by the process due to the testing substrate processing means is within a predetermined range relative to the targeted process result of the testing substrate;

a flow rate calculating means adapted for calculating the flow rate of the processing gas, based on the process result obtained by the process provided to the testing substrate as well as on the flow rate-process result-relationship model stored in the model storage means, when the process result is judged not to be within the predetermined range by the discriminating means; and a flow rate changing means adapted for changing the flow rate of the processing gas of the processing conditions into the flow rate of the processing gas calculated by the flow rate calculating means when the flow rate of the processing gas is calculated by the flow rate calculating means, such that the testing substrate will be processed, at the changed gas flow rate, by the testing substrate processing means.

2. The processing system according to claim 1, further comprising an object processing means, which is adapted for processing the object to be processed under the processing conditions extracted by the processing condition extracting means when the process result is judged to be within the predetermined range by the discriminating means.

3. The processing system according to claim 1, wherein the error information storage means is adapted for storing therein the error information about a loading effect of the object to be processed and that of the testing substrate.

4. The processing system according to claim 1, wherein the flow rate-process result-relationship model is prepared based on the process result obtained under two or more conditions, with respect to each element constituting the processing conditions, and can be adapted for changes of the processing conditions.

5. The processing system according to claim 1,
wherein the processing gas supply means includes a plurality of processing gas supply pipes respectively inserted through the processing chamber, and
wherein the flow rate calculating means is adapted for calculating the flow rate of the gas supplied from each processing gas supply pipe.

6. The processing system according to claim 1, further comprising, a processing condition updating means, which is adapted for updating the flow rate of the processing gas stored in the processing condition storage means by the flow rate of the processing gas calculated by the flow rate calculating means.

7. The processing system according to claim 1, wherein the processing chamber is divided into a plurality of zones, and
wherein the model storage means stores therein a flow rate-process result-relationship model indicative of the relationship between the flow rate of the processing gas and the process result for each zone.

8. The processing system according to claim 1, wherein the details of the process are related to a film forming process.

9. A processing method comprising:
a processing gas supplying step of supplying a processing gas into a processing chamber adapted for containing therein an object to be processed or a testing substrate for the object to be processed;

a processing condition storing step of storing processing conditions corresponding to details of a process, the processing conditions including a flow rate of the processing gas supplied in the processing gas supplying step;

an error information storing step of storing error information about an error of a process result attributable to a difference between the object to be processed and the testing substrate;

a model storing step of storing a flow rate-process result-relationship model indicative of a relationship between the flow rate of the processing gas and the process result;

a processing condition extracting step of calculating a targeted process result of the testing substrate from a targeted process result of the object to be processed, based on the error information stored in the error information storing step, and then extracting the processing conditions corresponding to the calculated targeted process result of the testing substrate, from the processing conditions stored in the processing condition storing step;

a testing substrate processing step of processing the testing substrate under the processing conditions extracted in the processing condition extracting step;

a discriminating step of discriminating whether or not the process result obtained by the process due to the testing substrate processing step is within a predetermined range relative to the targeted process result of the testing substrate;

a flow rate calculating step of calculating the flow rate of the processing gas, based on the process result obtained by the process provided to the testing substrate as well as on the flow rate-process result-relationship model stored in the model storing step, when the process result is judged not to be within the predetermined range in the discriminating step; and a flow rate changing step of changing the flow rate of the processing gas of the processing conditions into the flow rate of the processing gas calculated in the flow rate calculating step when the flow rate of the processing gas is calculated in the flow rate calculating step, such that the testing substrate will be processed, at the changed gas flow rate, in the testing substrate processing step.

10. The processing method according to claim 9, further comprising an object processing step, in which the object to be processed is processed under the processing conditions extracted in the processing condition extracting step when the process result is judged to be within the predetermined range in the discriminating step.

11. The processing method according to claim 9, wherein in the error information storing step, the error information about a loading effect of the object to be processed and that of the testing substrate is stored.

12. The processing method according to claim 9, wherein the flow rate-process result-relationship model is prepared based on the process result obtained under two or more conditions, with respect to each element constituting the processing conditions, and can be adapted for changes of the processing conditions.

13. The processing method according to claim 9,
wherein in the processing gas supplying step, the processing gas is supplied from a plurality of processing gas supply pipes respectively inserted through the processing chamber, and
wherein in the flow rate calculating step, the flow rate of the gas supplied from each processing gas supply pipe is calculated.

14. The processing method according to claim 9, further comprising an updating step of updating the flow rate of the processing gas stored in the processing condition storing step by the flow rate of the processing gas calculated in the flow rate calculating step.

15. The processing method according to claim 9,
wherein the processing chamber is divided into a plurality of zones, and
wherein in the model storing step, a flow rate-process result-relationship model indicative of the relationship between the flow rate of the processing gas and the process result for each zone, is stored.

16. The processing method according to claim 9, wherein the details of the process are related to a film forming process.

17. A computer-readable storage medium having computer program that causes a computer to function as:
a processing gas supply means adapted for supplying a processing gas into a processing chamber adapted for containing therein an object to be processed or a testing substrate for the object to be processed;
a processing condition storage means adapted for storing therein processing conditions corresponding to details of a process, the processing conditions including a flow rate of the processing gas supplied from the processing gas supply means;
an error information storage means adapted for storing therein error information about an error of a process result attributable to a difference between the object to be processed and the testing substrate;
a model storage means adapted for storing therein a flow rate-process result-relationship model indicative of a relationship between the flow rate of the processing gas and the process result;
a processing condition extracting means adapted for calculating a targeted process result of the testing substrate from a targeted process result of the object to be processed, based on the error information stored in the error information storage means, as well as adapted for extracting the processing conditions corresponding to the calculated targeted process result of the testing substrate, from the processing conditions stored in the processing condition storage means;
a testing substrate processing means adapted for processing the testing substrate under the processing conditions extracted by the processing condition extracting means;
a discriminating means adapted for discriminating whether or not the process result obtained by the process due to the testing substrate processing means is within a predetermined range relative to the targeted process result of the testing substrate;
a flow rate calculating means adapted for calculating the flow rate of the processing gas, based on the process result obtained by the process provided to the testing substrate as well as on the flow rate-process result-relationship model stored in the model storage means, when the process result is judged not to be within the predetermined range by the discriminating means; and
a flow rate changing means adapted for changing the flow rate of the processing gas of the processing conditions into the flow rate of the processing gas calculated by the flow rate calculating means when the flow rate of the processing gas is calculated by the flow rate calculating means, such that the testing substrate will be processed, at the changed gas flow rate, by the testing substrate processing means.

\* \* \* \* \*